United States Patent
Furukawa et al.

(10) Patent No.: US 8,432,717 B2
(45) Date of Patent: Apr. 30, 2013

(54) ONE-TIME PROGRAMMABLE CELL CIRCUIT, SEMICONDUCTOR INTEGRATED CIRCUIT INCLUDING THE SAME, AND DATA JUDGING METHOD THEREOF

(75) Inventors: Hiroyuki Furukawa, Kanagawa (JP); Isao Naritake, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 221 days.

(21) Appl. No.: 12/898,210

(22) Filed: Oct. 5, 2010

(65) Prior Publication Data
US 2011/0080764 A1 Apr. 7, 2011

(30) Foreign Application Priority Data
Oct. 5, 2009 (JP) ................................. 2009-231535

(51) Int. Cl.
*G11C 17/12* (2006.01)
(52) U.S. Cl.
USPC .................. 365/96; 365/189.15; 327/525
(58) Field of Classification Search .................. 365/96, 365/189.15; 327/525
See application file for complete search history.

(56) References Cited

U.S. PATENT DOCUMENTS

| 6,115,283 | A | 9/2000 | Hidaka |
|---|---|---|---|
| 2003/0231534 | A1 | 12/2003 | Takami |
| 2007/0258280 | A1* | 11/2007 | Dixon et al. ................ 365/96 |
| 2008/0117660 | A1* | 5/2008 | Xu et al. .................... 365/96 |
| 2008/0231313 | A1 | 9/2008 | Miyazaki et al. |

FOREIGN PATENT DOCUMENTS

| JP | 50-61956 | | 5/1975 |
|---|---|---|---|
| JP | 58-108092 | A | 6/1983 |
| JP | 2000-123592 | A | 4/2000 |
| JP | 2004-22736 | A | 1/2004 |
| JP | 2006-4507 | A | 1/2006 |
| JP | 2008-204600 | A | 9/2008 |
| JP | 2008-232702 | A | 10/2008 |

OTHER PUBLICATIONS

Japanese Office Action mailed Mar. 5, 2013 for corresponding Japanese Patent Application No. 2009-231535.

* cited by examiner

*Primary Examiner* — Hoai V Ho
(74) *Attorney, Agent, or Firm* — Sughrue Mion, PLLC (57) ABSTRACT

Provided is a semiconductor integrated circuit including: an anti-fuse element that electrically connects a first node and a first power supply terminal when data is written and electrically disconnect the first node and the first power supply terminal when data is not written; a first switch circuit that is connected between the first node and a first data line applied with a predetermine first voltage, and enters an off state from an on state according to a first control signal; and a detection part that detects write data of the anti-fuse element according to whether a voltage of the first node is substantially the same as the first voltage or substantially the same as a supply voltage of the first power supply terminal when the first switch circuit enters the off state.

9 Claims, 8 Drawing Sheets

PRIOR ART

ONE-TIME PROGRAMMABLE CELL CIRCUIT, SEMICONDUCTOR INTEGRATED CIRCUIT INCLUDING THE SAME, AND DATA JUDGING METHOD THEREOF

INCORPORATION BY REFERENCE

This application is based upon and claims the benefit of priority from Japanese patent application No. 2009-231535, filed on Oct. 5, 2009, the disclosure of which is incorporated herein in its entirety by reference.

BACKGROUND

1. Field of the Invention

The present invention relates to an one-time programmable cell, a semiconductor integrated circuit including the same, and data judging method thereof.

2. Description of Related Art

An OTP (One-time programmable) cell is widely applied as a single memory or a memory array in a semiconductor integrated circuit. For instance, information written in the OTP cell array is used as a chip ID, a setting parameter, or the like.

Figure 6:
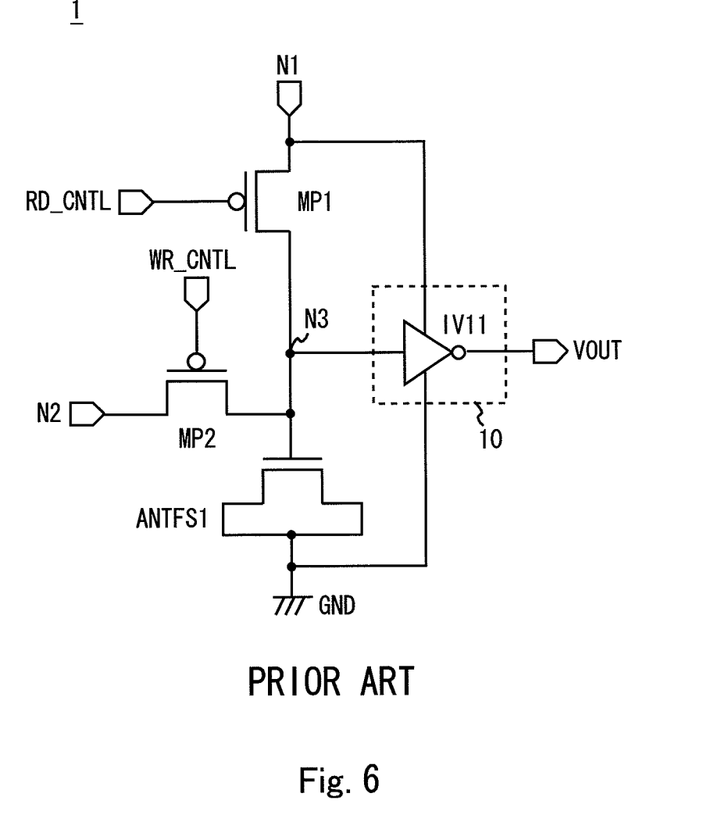
FIG. 6 shows a configuration of an OTP cell in accordance with a prior art.

A configuration of an OTP cell is disclosed in Japanese Unexamined Patent Application Publication No. 2008-204600, as a prior art. FIG. 6 shows the configuration of an OTP cell 1 of Japanese Unexamined Patent Application Publication No. 2008-204600. As shown in FIG. 6, the OTP cell 1 includes an anti-fuse element ANTFS1, PMOS transistors MP1 and MP2, and a detection circuit 10.

The PMOS transistor MP1 is connected between nodes N1 and N3. A reading control signal RD_CNTL is supplied to a gate of the PMOS transistor MP1. The PMOS transistor MP2 is connected between nodes N2 and N3. A writing control signal WR_CNTL is supplied to a gate of the PMOS transistor MP2. The anti-fuse element ANTFS1 is connected between the node N3 and a ground terminal GND.

The detection circuit 10 includes an inverter circuit IV11. An input terminal of the inverter circuit IV11 is connected to the node N3. An output voltage VOUT is output from an output terminal of the inverter circuit IV11. A power supply voltage VDD is supplied to the node N1, and a high voltage VPP (VPP>VDD) is supplied to the node N2.

The OTP cell 1 performs a fuse programming operation by destroying an insulation film of the anti-fuse element ANTFS1. The fuse programming operation of the OTP cell 1 is briefly explained below.

First, when data is written into the anti-fuse element ANTFS1, the writing control signal WR_CNTL is set to a low level and the reading control signal RD_CNTL is set to a high level. Thus, the PMOS transistor MP2 enters an on state and the PMOS transistor MP1 enters an off state. Then, the nodes N2 and N3 are connected electrically, and the node N1 and N3 are electrically disconnected. Therefore, the high voltage VPP is applied to both ends of the anti-fuse element ANTFS1.

The High voltage VPP is a voltage that exceeds a breakdown voltage of an oxide film of the anti-fuse element ANTFS1. For this reason, the oxide film of the anti-fuse element ANTFS1 is destroyed, and the node N3 and the ground terminal GND are in a conduction state. When the insulation film (oxide film) of the anti-fuse element ANTFS1 is destroyed and the data writing is carried out, the anti-fuse element ANTFS1 has resistance value in a range of several $k\Omega$ to hundreds of $k\Omega$ depending on the destruction state of the insulation film.

Next, when the data written in the anti-fuse element ANTFS1 is read, the writing control signal WR_CNTL is set to the high level and the reading control signal RD_CNTL is set to the low level. Thus, the PMOS transistor MP2 enters the off state and the PMOS transistor MP1 enters the on state. Then, the nodes N2 and N3 are electrically disconnected, and the nodes N1 and N3 are connected electrically. Therefore, the power supply voltage VDD is applied to both ends of the anti-fuse element ANTFS1. As a result, a current flows to the ground terminal GND through the node N1, the PMOS transistor MP1, the node N3, and the anti-fuse element ANTFS1, the insulation film of which is destroyed.

The inverter circuit IV11 buffers a voltage VN3 of the node N3 according to the current that flows through the node N1 to the ground terminal, and outputs the voltage as the voltage VOUT.

Therefore, when the data is not written in the anti-fuse element ANTFS1, the voltage VN3 of the node N3 becomes substantially equal to the power supply voltage VDD and the output voltage VOUT becomes low level. Contrarily, when the data is written in the anti-fuse element ANTFS1, the voltage VN3 of the node N3 decreases to the ground voltage GND side and the output voltage VOUT becomes high level depending on the destruction state of the insulation film of the anti-fuse element ANTFS1.

SUMMARY

As described above, the fuse programming of the OTP cell 1 is carried out by destroying the insulation film of the anti-fuse element ANTFS1. The conduction state of the anti-fuse element ANTFS1 after writing the data is determined according to the destruction state of the gate insulation film. In other words, the resistance value of the anti-fuse element ANTFS1 after writing the data is determined according to the destruction state of the gate insulation film. Therefore, the level of the voltage VN3 of the node N3 is also determined according to the destruction state of the gate insulation film.

However, the resistance value of the anti-fuse element ANTFS1 after writing the data varies in a range of several $k\Omega$ to hundreds of $k\Omega$ depending on the destruction state of the insulation film. Therefore, the voltage VN3 of the node N3 detected by the detection circuit 10 also varies depending on the variation in the resistance value of the anti-fuse element ANTFS1.

Figure 7:
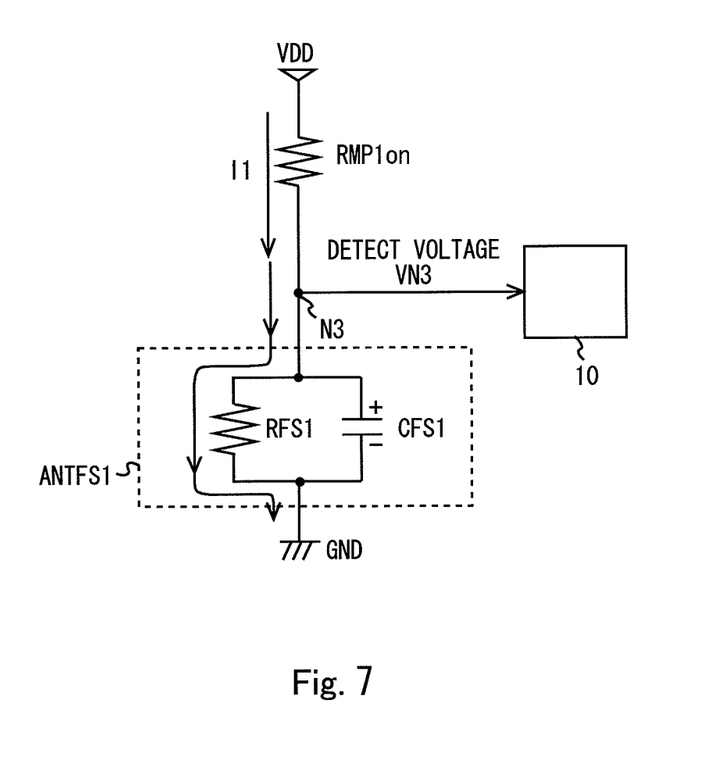
FIG. 7 is a schematic diagram illustrating a reading data operation of an anti-fuse element of the OTP cell in accordance with a prior art.

Here, FIG. 7 shows a schematic diagram illustrating the data reading operation of the anti-fuse element ANTFS1 in the OTP cell of the prior art. Referring to FIG. 7, a resistance RMP1on is an on-resistance of the PMOS transistor MP1, a resistance RFS1 is a resistance of the insulation film of the anti-fuse element ANTFS1, and a capacitor CFS1 is a capacitor of the insulation film of the anti-fuse element ANTFS1.

As shown in FIG. 7, when the data reading of the anti-fuse element ANTFS1 is carried out, the PMOS transistor MP1 is turned on to apply a DC bias (the power supply voltage VDD in FIG. 7). Then, the voltage VN3 of the node N3, which is generated by resistance division of the resistance RMP1on and the resistance RFS1, is detected by the detection circuit 10. When the DC bias is applied, an impedance of the capacitor CFS1 can be considered to be infinite irrespective of the magnitude of a capacitance value. Then, the capacitor CFS1 can be disregarded as an open circuit.

Figure 8:
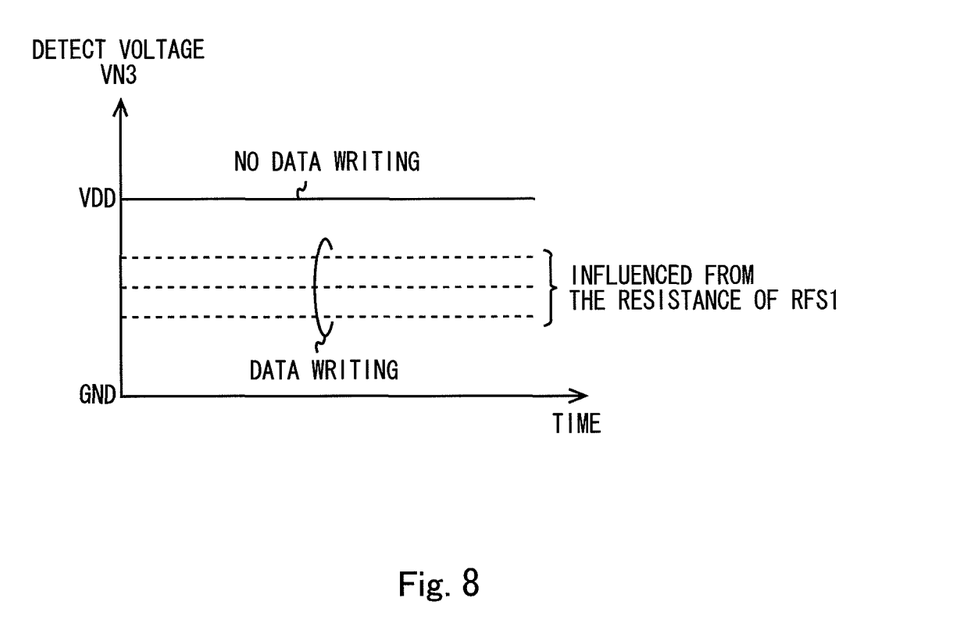
FIG. 8 is a graph illustrating a reading data operation of the anti-fuse element of the OTP cell in accordance with a prior art.

FIG. 8 is a graph showing the voltage VN3 of the node N3 in the case where the data is written in the anti-fuse element ANTFS1 and where the data is not written therein. As shown in FIG. 8, when no data is written, the resistance RFS1 can be several orders of magnitude greater than the resistance RMP1*on*. Thus, the voltage VN3 is substantially equal to the power supply voltage VDD. On the other hand, when the data is written, the resistance RFS1 has a very small value, for instance, a value substantially equal to the resistance RMP1*on*. However, the resistance value of the resistance RFS1 varies in a range of several kΩ to hundreds of kΩ depending on the destruction state of the insulation film, as described above. Consequently, the voltage VN3 detected by the detection circuit 10 is influenced by a variation in the resistance value of the resistance RFS1, and therefore the voltage VN3 is not constant.

Thus, when the data is written, the voltage VN3 of the node N3 detected by the detection circuit 10 is susceptible to the variation in the resistance value of the insulation film destroyed in the anti-fuse element ANTFS1. Therefore, the detection circuit 10 may make a misjudgment, if a threshold voltage of the inverter circuit IV11 is not adjusted to an appropriate value according to this variation. This result in a problem that a correct value of data such as a chip ID and a setting parameter stored in the semiconductor integrated circuit where a cell array is composed of this OTP cell 1 cannot be read.

A first exemplary aspect of the invention is a semiconductor integrated circuit including: an anti-fuse element that electrically connects a first node and a first power supply terminal when data is written and electrically disconnects the first node and the first power supply terminal when data is not written; a first switch circuit that is connected between the first node and a first data line applied with a predetermine first voltage, and enters an off state from an on state according to a first control signal; and a detection part that detects write data of the anti-fuse element according to whether a voltage of the first node is substantially the same as the first voltage or is substantially the same as a supply voltage of the first power supply terminal when the first switch circuit enters the off state.

A second exemplary aspect of the invention is an one-time programmable cell circuit including: an anti-fuse element that electrically connects a first node and a first power supply terminal when data is written and electrically disconnects the first node and the first power supply terminal when data is not written; a first switch circuit that is connected between the first node and a first data line applied with a predetermine first voltage, and enters an off state from an on state according to a first control signal; and a detection part that detects write data of the anti-fuse element according to whether a voltage of the first node is substantially the same as the first voltage or is substantially the same as a supply voltage of the first power supply terminal when the first switch circuit enters the off state.

A third exemplary aspect of the invention is a data judging method of a data of a semiconductor integrated circuit that includes an anti-fuse element that electrically connects a first node and a first power supply terminal when data is written and electrically disconnects the first node and the first power supply terminal when data is not written, the method including: switching a first switch circuit from an on state to an off state, the first switch circuit being connected between the first node and a first data line applied with a predetermine first voltage; and detecting write data of the anti-fuse element according to whether a voltage of the first node is substantially the same as the first voltage or is substantially the same voltage as a supply voltage of the first power supply terminal when the first switch circuit the enters off state.

In the semiconductor integrated circuit according to the first exemplary aspect of the present invention, the first switch circuit that enters the on state allows the voltage of the first node to be equal to the first voltage. After the first switch circuit enters the off state, the voltage of the first node becomes substantially the same as the first voltage or substantially the same as the supplied voltage from the first power supply terminal, depending on the state of data written in the anti-fuse element. The writing data of the anti-fuse element can be judged, because the detection part detects the voltage of the first node. Therefore, when the writing data of the anti-fuse element is detected, the semiconductor integrated circuit can judge the data without using the voltage generated by the current flowing to the anti-fuse element. Accordingly, the semiconductor integrated circuit is capable of judging the data of the anti-fuse element, irrespective of the variation in the resistance of the anti-fuse element after writing the data.

A semiconductor integrated circuit according to an exemplary aspect of the present invention, can prevent a misjudgment when data of an anti-fuse element is read.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
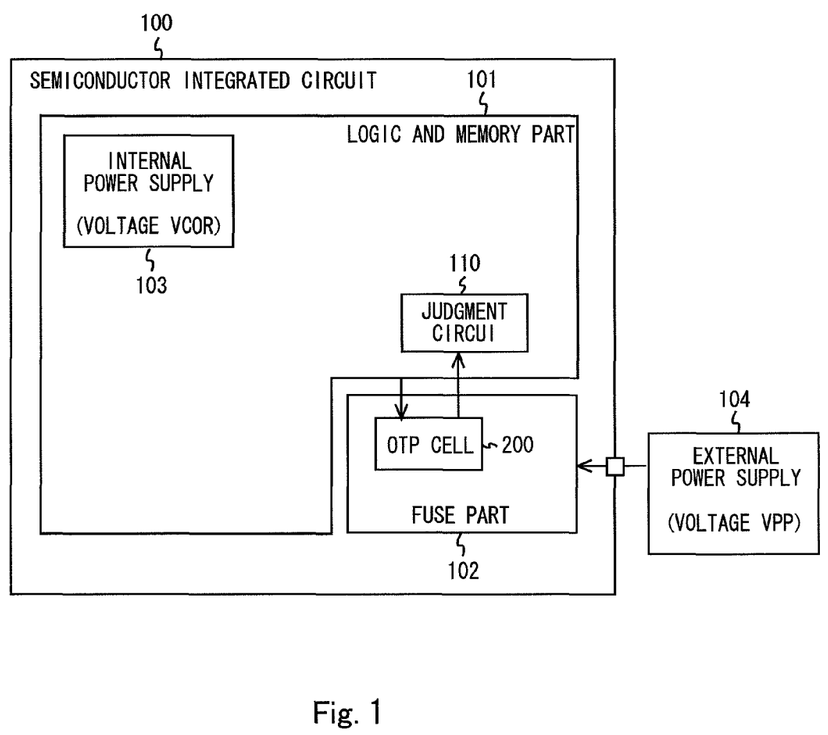
FIG. 1 shows an exemplary configuration of a semiconductor integrated circuit in accordance with an exemplary embodiment of the present invention.

An exemplary embodiment of the present invention will be described in detail below with reference to the accompanying drawings. In the exemplary embodiment, the present invention is applied to a semiconductor integrated circuit and an OTP cell. FIG. 1 shows a configuration of a semiconductor integrated circuit 100 according to this exemplary embodiment. As shown in FIG. 1, the semiconductor integrated circuit 100 includes a logic and memory part 101 and a fuse part 102.

The logic and memory part 101 is composed of logic circuits that perform logic operations. Further, the logic and memory part 101 includes an internal power supply 103 that supplies a voltage VCOR of about 1 to 2 [V] as a power supply voltage of the logic circuits. Furthermore, the logic and memory part 101 includes a judgment circuit 110 which is described later. The logic circuits of the logic and memory part 101 are composed of transistors that have a breakdown voltage of about the voltage VCOR level. In the following, the transistor that has the breakdown voltage of about the voltage VCOR level is called "low breakdown voltage transistor".

The fuse part 102 includes an OTP cell 200. A voltage of 6 [V] for data writing of the OTP cell 200 is supplied to the fuse part 102 from an external terminal of the semiconductor integrated circuit 100. An external power supply 104 is connected to the external terminal of the semiconductor integrated circuit 100. The external power supply 104 supplies the voltage of 6 [V] (a high voltage VPP) for the data writing to the anti-fuse element described later. Note that the voltage value of "6 [V]" is one example. The external power supply 104 may supply a voltage equal to or higher than VCOR that is the power supply voltage of the logic circuits mentioned above.

In addition, in FIG. 1, only the OTP cell 200 has been described for simplification of the drawing. However, when the OTP cell in the fuse part 102 of the semiconductor integrated circuit 100 is composed of a cell array, two or more OTP cells that have a similar configuration of the OTP cell 200 are assumed to exist.

Figure 2:
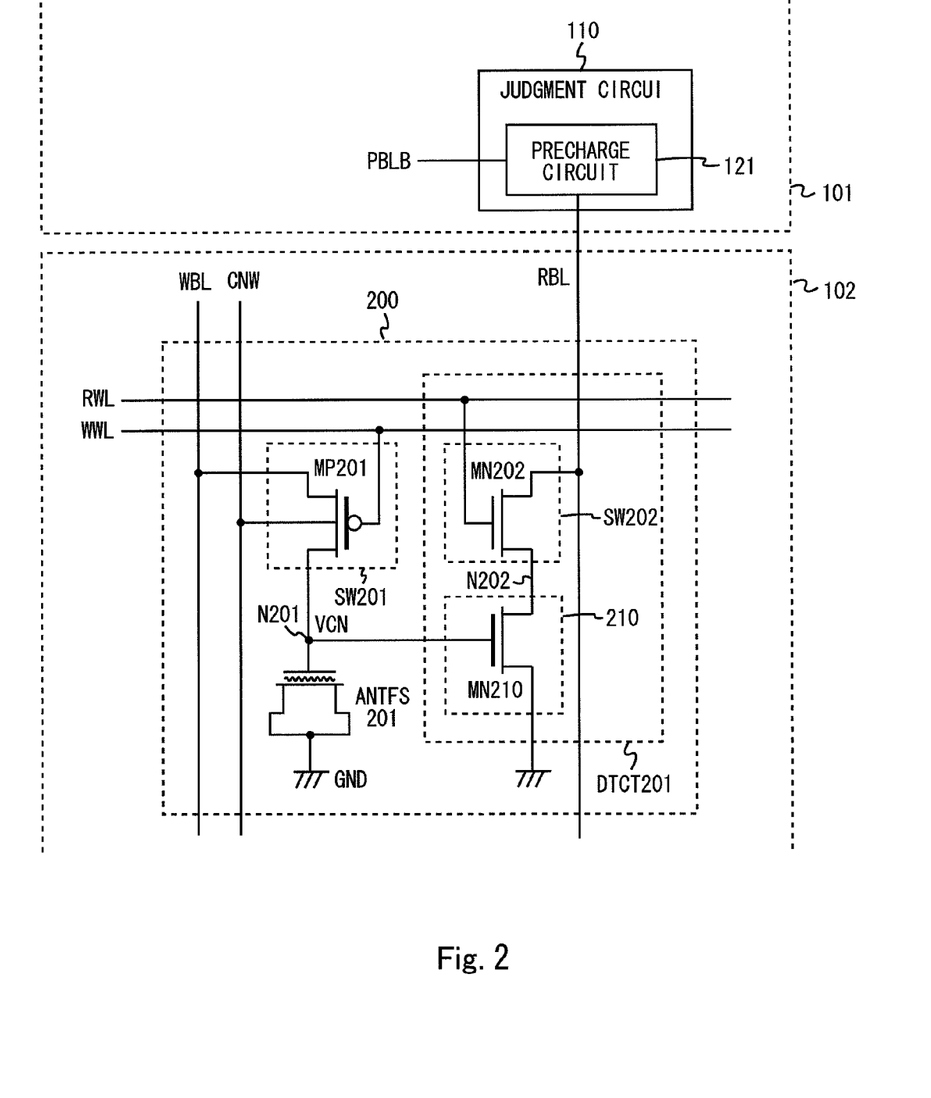
FIG. 2 shows an exemplary configuration of an OTP cell in accordance with the exemplary embodiment of the present invention.

FIG. 2 shows an exemplary configuration of the fuse part 102. The fuse part 102 includes the OTP cell 200. The OTP cell 200 includes a switch circuit SW201, a detection part DTCT201, and an anti-fuse element ANTFS201.

The anti-fuse element ANTFS201 is connected between a node N201 and a ground terminal GND. The anti-fuse element ANTFS201 is a fuse that is normally in an insulating state. However, the anti-fuse element ANTFS201 is brought into a conduction state by applying a program voltage to destroy an insulation film. For instance, the anti-fuse element ANTFS201 is achieved by a gate insulation film of a MOS transistor. In this case, a gate capacitor of the anti-fuse element ANTFS201 usually has a resistance of several MΩ or more, thereby keeping an insulating state between the gate and a substrate of the MOS transistor. Meanwhile, when the program voltage, for example, the voltage of 6 [V] for the data writing as above mentioned, is applied between the substrate and the gate of the MOS transistor, the gate insulation film is destroyed, and then the gate and the substrate are short-circuited. However, the anti-fuse element ANTFS201 in this case has a resistance value of several kΩ to hundreds of kΩ depending on the destruction state of the gate insulation film between the gate and the substrate.

In the following, an operation of writing data into the anti-fuse element by applying the program voltage to the anti-fuse element destroy the insulation film (oxide film) so as to bring the anti-fuse element into the conduction state is called an operation of "writing data". The resistance of the anti-fuse element ANTFS201 after writing data varies in a range of several kΩ to hundreds of kΩ depending on the destruction state of the insulation film. Moreover, the OTP cell 200 in which the data has been written in the anti-fuse element ANTFS201 is called "0-CELL". The OTP cell 200 in which the data has not been written in the data in the anti-fuse element ANTFS201 is called "1-CELL".

The switch circuit SW201 includes a PMOS transistor MP201. The PMOS transistor MP201 is connected between a writing data line WBL and the node N201. A gate of the PMOS transistor MP201 is connected to a writing control signal line WWL. A back gate of the PMOS transistor MP201 is connected to a back gate drive signal line CNW. The PMOS transistor MP201 has a breakdown voltage relative to the high voltage VPP (voltage of 6 [V] for writing data) for writing the data in the anti-fuse element mentioned above. As the transistor that has such a breakdown voltage relative to the high voltage VPP, there is known a transistor having an MOX (multi oxide) structure, for instance. A threshold voltage of the PMOS transistor MP201 is set to about the voltage VCOR. In the following, the transistor having the breakdown voltage relative to the high voltage VPP is called a high breakdown voltage transistor. For convenience of description, reference symbols "WBL", "WWL", and "CNW" represent line names, respectively, and also represent a control signal or a driving signal applied to the lines.

The detection part DTCT201 includes a switch circuit SW202 and a detection circuit 210. The detection part DTCT201 detects a voltage level of the node N201 and outputs a detection result to a reading data line RBL.

The switch circuit SW202 includes an NMOS transistor MN202. The NMOS transistor MN202 is connected between the reading data line RBL and a node N202. A gate of the NMOS transistor MN202 is connected to a reading control signal line RWL. A threshold voltage of the NMOS transistor MN202 is set to about the voltage VCOR. For convenience of description, reference symbols "RBL" and "RWL" represent line names, respectively, and also represent a control signal or a driving signal applied to the lines.

The detection circuit 210 includes an NMOS transistor MN210. The NMOS transistor MN210 is connected between the node N202 and the ground terminal GND. A gate of the NMOS transistor MN210 is connected to the node N201. The NMOS transistor MN210 is the high breakdown voltage transistor having a breakdown voltage relative to the high voltage VPP for writing the data in the anti-fuse element mentioned above. A threshold voltage of the NMOS transistor MN210 is set to about the voltage VCOR.

The reading data line RBL is connected to the judgment circuit 110. The judgment circuit 110 judges whether the data has been written or not in the anti-fuse element ANTFS201 according to the voltage level of the reading data line RBL. In the following, an operation in which the judgment circuit 110 judges whether the data has been written or not and reads the data stored in the anti-fuse element ANTFS201 is called an operation of "reading data".

Moreover, the judgment circuit 110 includes a precharge circuit 121. The precharge circuit 121 pre-charges the reading data line RBL to a predetermine voltage (for example, about VCOR which is equal to the power supply voltage of the logic circuits) according to a precharge control signal PBLB. The precharge circuit 121 may be arranged outside the judgment circuit 110. Furthermore, the precharge circuit 121 is not necessarily arranged within the logic and memory part 101, but may be arranged within the fuse part 102.

The operation of the semiconductor integrated circuit 100 according to this exemplary embodiment is described hereinafter. First, the operation when the data is written in the anti-fuse element ANTFS201 is described. When the data is written in the anti-fuse element ANTFS201, the high voltage VPP for the data writing, for instance, a voltage of about 6 [V] mentioned above, is applied to the writing data line WBL and the back gate drive signal line CNW. At the same time, the PMOS transistor MP201 enters an on state when the writing control signal line WWL is set to a low level (for instance, the ground voltage GND). Then, the writing data line WBL and the node N201 are connected electrically. Therefore, the high voltage VPP is applied to the gate of the anti-fuse element ANTFS201, thereby destroying the gate insulation film. As a result, the gate and the substrate are short-circuited. The data is written in the anti-fuse element ANTFS201 by the above-mentioned operation, and the OTP cell 200 becomes the 0-CELL.

Figure 3:
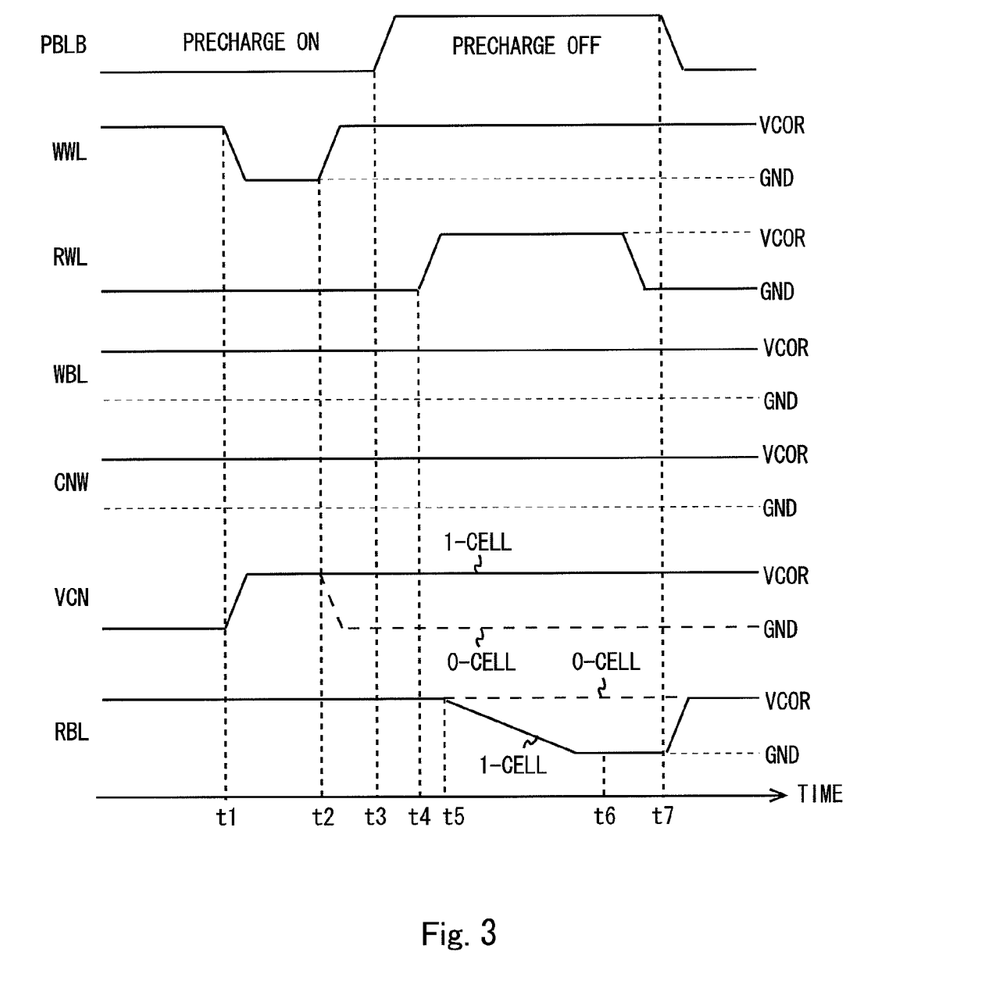
FIG. 3 is a timing diagram illustrating a reading data operation of the semiconductor integrated circuit in accordance with the exemplary embodiment of the present invention.

Next, the data reading operation of the anti-fuse element ANTFS201 is described with reference to FIG. 3. First, as shown in FIG. 3, the voltage level of each of the writing data line WBL and the back gate drive signal line CNW is set to the voltage VCOR of about 1 to 2 [V] of the power supply voltage of the logic circuits when the data is read. Moreover, the voltage level of the writing control signal WWL of high level is also set to the voltage VCOR.

At time t1, the writing control signal line WWL is lowered to the low level (the ground voltage GND). Thus, the PMOS transistor MP201 enters the on state, and the writing data line WBL and the node N201 are connected electrically. Therefore, the voltage of the node N201 (Hereafter, it is called "voltage VCN") rises to the voltage VCOR.

Next, at time t2, the writing control signal line WWL is raised to the high level (the voltage VCOR). Therefore, the PMOS transistor MP201 enters the off state, and the writing data line WBL and the node N201 are electrically disconnected.

At this time, when the data is not written in the anti-fuse element ANTFS201 (1-CELL), the node N201 enters a high-impedance state and the voltage VCN is kept at the voltage VCOR. Meanwhile, when the data has been written in the anti-fuse element ANTFS201 (0-CELL), the gate and the substrate of the anti-fuse element ANTFS201 are short-circuited. The anti-fuse element ANTFS201 has some resistance between the gate and the substrate. Therefore, the node N201 and the ground terminal GND are also short-circuited, with the result that the voltage VCN decreases from the voltage VCOR to the ground voltage GND.

In other word, when the data is not written in the anti-fuse element ANTFS201 (1-CELL), the voltage level of the node N201 is equal to the voltage VCOR (high level), and when the data is written in the anti-fuse element ANTFS201 (0-CELL), the voltage level of the node N201 is equal the ground voltage (low level). The period in which the voltage VCN decreases from the voltage VCOR to the ground voltage GND depends on a time constant that is determined by a parasitic capacitance of the node N201 (including the insulation film capacity of the anti-fuse element ANTFS201) and on the resistance of the anti-fuse element ANTFS201. However, the voltage VCOR as a charge voltage to this parasitic capacitance is a low voltage of about 1 to 2 [V] as described later, and the amount of stored charge is small. Further, the resistance of the anti-fuse element ANTFS201 is very small.

At time t3, the precharge control signal PBLB becomes high level, and the precharge operation in which the precharge circuit 121 pre-charges the reading data line RBL enters an off state.

At time t4, the reading control signal line RWL is raised to the high level (voltage VCOR). Therefore, the NMOS transistor MN202 enters the on state, and the reading data line RBL and the node N202 are connected electrically.

At this time, the NMOS transistor MN210 is in the on state when the data is not written in the anti-fuse element ANTFS201 (1-CELL), because the voltage VCN of the node N201 is kept at the voltage VCOR (high level) as mentioned above. Therefore, the node N202 and the ground terminal GND are connected electrically, and the reading data line RBL and the ground terminal GND are connected electrically. Consequently, the voltage of the reading data line RBL decreases to the ground voltage GND. In other word, the reading data line RBL falls to the low level.

Meanwhile, the NMOS transistor MN210 is in the off state when the data has been written in the anti-fuse element ANTFS201 (0-CELL), because the voltage VCN of the node N201 is equal to the ground voltage GND (low level) as mentioned above. Thus, the node N202 and the ground terminal GND are electrically disconnected. Therefore, the voltage of the reading data line RBL does not decrease but is kept at the high level.

In summary, the NMOS transistor MN210 dynamically detects a difference between the voltage VCN (high level) of the node N201 when the data is not written into the anti-fuse element ANTFS201 (1-CELL) and the voltage GND (low level) of the node N201 when the data has been written in the anti-fuse element ANTFS201 (0-CELL). The on state and the off state of the NMOS transistor MN210 are decided based on the detection result. Then, the voltage of the node N202 is output to the reading control signal line RWL when the NMOS transistor MN202 is in the on state.

At time t6 after a predetermined period from time t5, the judgment circuit 110 judges the voltage level of the reading data line RBL, thereby judging whether the data has been written into the anti-fuse element ANTFS201. In summary, the judgment circuit 110 can determine that the data has been written in the anti-fuse element ANTFS201 when the reading data line RBL is at the low level. Meanwhile, the judgment circuit 110 can determine that the data has not been written in the anti-fuse element ANTFS201 when the reading data line RBL is at the high level.

After that, the reading control signal line RWL is lowered to the low level to bring the NMOS transistor MN202 into the off state. At time t7, the precharge circuit 121 pre-charges the reading data line RBL according to the precharge control signal PBLB. Then, the reading operation ends.

In the OTP cell 1 of prior art, the voltage level of the voltage VN3 of the node N3 is decided depending on the destruction state of the gate insulation film of the anti-fuse element ANTFS1, because the resistance of the anti-fuse element ANTFS1 is decided depending on the destruction state of the gate insulation film. However, the resistance of the anti-fuse element ANTFS201 after writing the data varies in the range of several kΩ to hundreds of kΩ depending on the destruction state of the insulation film.

As described above referring to FIG. 8, when the data is not written in the anti-fuse element ANTFS201, the voltage VN3 is substantially equal to the power supply voltage VDD because the resistance RFS1 can be several orders of magnitude greater than the resistance RMP1on. On the other hand, when the data is written in the anti-fuse element ANTFS201, the resistance RFS1 has a very small value. Then, the resistance RFS1 can be substantially equal to the resistance RMP1on and varies in the range of several kΩ to hundreds of kΩ depending on the destruction state of the insulation film, as described above. Consequentially, the voltage VN3 of the node N3 detected by the detection circuit 10 is influenced by a variation in the resistance value of the resistance RFS1, and thus the voltage VN3 is not constant.

As just described, the OTP cell of the related art has a problem that the voltage VN3 of the node N3 detected by the detection circuit 10 when the data is written is susceptible to the variation in the resistance of the insulation film destroyed in the anti-fuse element ANTFS1. Therefore, the detection circuit 10 may make a misjudgment, if a threshold voltage of the inverter circuit IV11 of the detection circuit 10 is not adjusted to an appropriate value according to this variation. This poses another problem that a correct value of data of such as a chip ID and a setting parameter stored in the semiconductor integrated circuit constituting a cell array of the OTP cell 1 cannot be read. To deal with such a problem, the threshold voltage of the inverter circuit IV11 must be adjusted to a proper value according to this variation, leading to difficulty in designing the detection circuit 10.

However, in the semiconductor integrated circuit 100 that has the OTP cell 200 in accordance with this exemplary embodiment, the voltage generated with the current that flows to the anti-fuse element ANTFS201 is not used to judge whether the data is written in the anti-fuse element ANTFS201.

Figure 4:
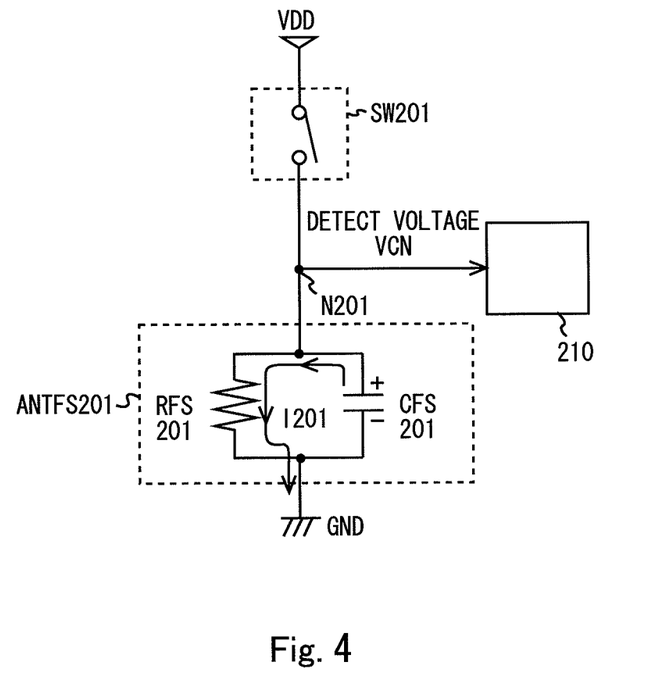
FIG. 4 is a schematic diagram illustrating a reading data operation of an anti-fuse element of an OTP cell in accordance with the exemplary embodiment of the present invention.

Here, FIG. 4 shows a schematic diagram illustrating the data reading operation of the anti-fuse element ANTFS201 in the OTP cell 200 in accordance with this exemplary embodiment. A resistance RFS201 shown in FIG. 4 is a resistance of the insulation film of the anti-fuse element ANTFS201. Moreover, a capacitor CFS201 is a capacitor of the insulation film of the anti-fuse element ANTFS201.

As shown is FIG. 4, in the OTP cell 200 in accordance with this exemplary embodiment, during the reading data operation, the capacitor CFS201 of the insulation film of the anti-fuse element ANTFS201 is charged up to the applied voltage (the power supply voltage VDD in the example of FIG. 4) when the switch circuit SW201 is in the on state. When the switch circuit SW201 is in the off state, the capacitor CFS201 is discharged through the resistor RFS201 of the anti-fuse element ANTFS201. Then, the detection circuit 210 monitors the discharge voltage. The length of this discharge period depends on a time constant determined by a product of value of the resistance RFS201 and the capacitor CFS201 of the anti-fuse element ANTFS201.

Figure 5:
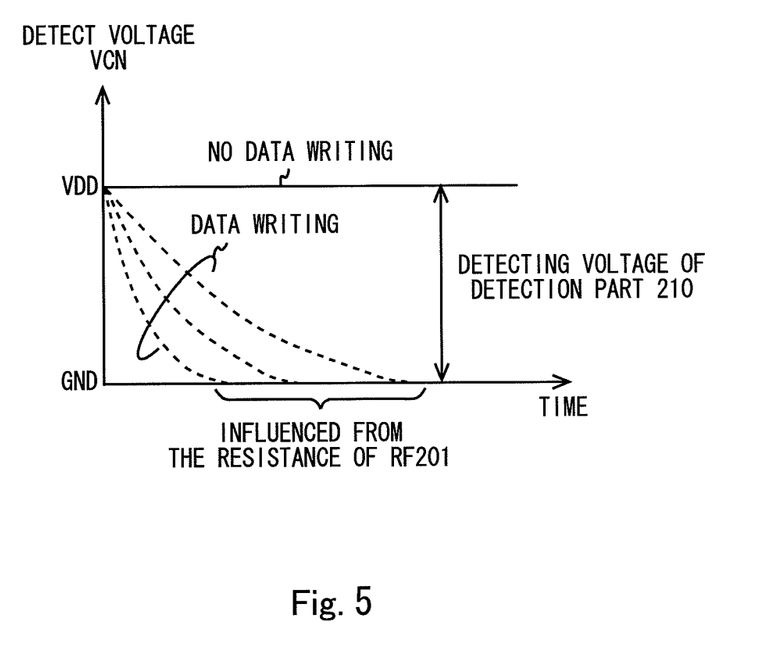
FIG. 5 is a graph illustrating a reading data operation of the anti-fuse element of the OTP cell in accordance with the exemplary embodiment of the present invention.

FIG. 5 is a graph showing the voltage VCN of the node N201 in the cases where the data is written in the anti-fuse element ANTFS201 and where the data is not written therein. As shown in FIG. 5, when the data is not written in the anti-fuse element ANTFS201, the value of the capacitor CFS201 is large and the value of the resistance RFS201 is very large because the insulation film is not destroyed. Therefore, the voltage VCN of the node N201 is kept at about the voltage VCOR. On the other hand, when the data is written in the anti-fuse element ANTFS201, the insulation film of the anti-fuse element ANTFS201 is destroyed, and thus the capacitance value of the capacitor CFS201 and the value of the resistance RFS201 are small. Therefore, the time constant determined by a product of value of the resistance RFS201 and the capacitor CFS201 is very small. Accordingly, the value of the resistance RFS201 varies in the range of several kΩ to hundreds of kΩ depending on the destruction state of the insulation film, as with the OTP cell 1 of prior art. However, in this exemplary embodiment, the variation in time constant within a certain time period is small enough to complete the discharge. Then, the detection circuit 210 detects whether the voltage VCN of the node N201 is equal to the power supply voltage VDD or the ground voltage GND.

As just described, the OTP cell 200 according to this exemplary embodiment is different from the OTP cell 1 of prior art in the following respect. In the OTP cell 200, the detection result is hardly affected by the variation in the resistance of the insulation film of the anti-fuse element ANTFS201. Further, in this exemplary embodiment, the voltage VCOR of about 1 to 2 [V] is used as the power supply voltage VDD as mentioned above. Moreover, the capacitor CFS201 of the insulation film of the anti-fuse element ANTFS201 is very small. Therefore, the discharge speed is very fast because the value of charge of the capacitor CFS201 is small. This allows the detection circuit 210 to perform the detection operation at high speed.

As mentioned above, when the data is read, the NMOS transistor MN210 that is the detection circuit 210 detects whether the voltage level of the node N201 is equal to the voltage VCOR (high level) or the ground voltage GND (low level) in the OTP cell 200. Then, the detection circuit 210 changes the voltage level of the reading data line RBL according to the detection result. Further, the judgment circuit 110 judges whether the data is written or not in the anti-fuse element ANTFS201 according to the voltage level of the reading data line RBL. In other word, in the semiconductor integrated circuit 100, whether the OTP cell 200 is the 0-CELL or the 1-CELL is judged indirectly by using the conduction state of the NMOS transistor MN210 of the detection circuit 210 without using the current that flows to the anti-fuse element ANTFS201.

As just described, in the OTP cell 200 of this exemplary embodiment, the detection result of the detection circuit 210 that dynamically detects the voltage level of the node N201 is used, instead of making a direct judgment using the voltage generated by the current that flows to the anti-fuse element ANTFS201. In other word, the voltage difference between the voltage VCOR of the node N201 when the data is not written in the anti-fuse element ANTFS201 (1-CELL) and the voltage GND of the node N201 when the data is written in the anti-fuse element ANTFS201 (0-CELL) is dynamically detected by the NMOS transistor MN210. Here, in the OTP cell 1, it is necessary to adjust the detection circuit 10 according to the variation in the resistance after writing the data. In other word, the threshold voltage of the inverter circuit IV11 needs to be adjusted to an appropriate value according to the variation. On the other hand, the OTP cell 200 does not require adjustment of the detection circuit 210 according to the resistance value of the anti-fuse element ANTFS201 after writing the data. As a result, the problem that a misjudgment occurs when the threshold voltage of the inverter circuit IV11 is not adjusted to an appropriate value in the OTP cell 1 does not occur in the OTP cell 200 of this exemplary embodiment. Therefore, the chip ID, the setting parameter, or the like stored in the semiconductor integrated circuit 100 in which a cell array is composed of the OTP cell 200 can be correctly read without any misjudgment.

In the OTP cell 1, the PMOS transistors MP1 and MP2 and the inverter circuit IV need to be composed of the high breakdown voltage transistors in consideration of the high voltage VPP (for instance, about 6 [V]) when the data is written in the anti-fuse element ANTFS1. Examples of the high breakdown voltage transistor include a transistor having a breakdown voltage of 3.3 [V] and having an MOX (multi-oxide) structure. Here, the gate oxide film of the transistor having the MOX structure is thick, and the size of the transistor is large. This causes a problem that the circuit size of the OTP cell 1 increases because the PMOS transistors MP1 and MP2 and the inverter circuit IV11 are composed of high breakdown voltage transistors like the transistor having the MOX structure.

Moreover, in the OTP cell 1, when the data is read, the PMOS transistor MP1 is set to on state to allow, and then a current to flow through a current path that is composed of the node N1, the PMOS transistor MP1, the node N3, the anti-fuse element ANTFS1, and the ground terminal GND. However, when the power supply voltage VDD applied to the node N1 is equal to the voltage VCOR of about 1 to 2 [V] as mentioned above, the PMOS transistor MP1 composed of the high breakdown voltage transistor may allow only a small current to flow through the current path mentioned above. Therefore, the detection circuit 10 capable of detection with extremely high accuracy is required to judge the data reading according to this small current value, resulting in an increase in the difficulty of the circuit design.

To deal with such a problem, the power supply voltage VDD applied to the node N1 may be set to a high voltage like a writing voltage. However, this causes another problem that the power consumption increases when the data is read in the OTP cell 1. Furthermore, when the power supply voltage VDD applied to the node N1 is set to the high voltage like the writing voltage, the high voltage is to be applied for each data reading. Therefore, the possibility of destroying the insulation film of the anti-fuse element ANTFS1 in which the data is not written increases in the 1-CELL. Accordingly, there is a problem of shortening the lifetime of the anti-fuse element ANTFS1 in which the data is not written in the 1-CELL.

However, the OTP cell 200 of this exemplary embodiment utilizes, as mentioned above, the detection result of the detection circuit 210 that dynamically detects the voltage level of the node N201, instead of making a direct judgment using the voltage generated by the current that flows to the anti-fuse element ANTFS201. Therefore, the detection circuit 210 only has to be able to detect the voltage level of the node N201, and there is no problem if the current that flows to the anti-fuse element ANTFS201 is small. Thus, the OTP cell 200 has an advantage that the detection circuit 210 that corresponds to the detection circuit 10 of the OTP cell 1 need not be designed with extremely high accuracy.

In addition, there is no problem if the current that flows to the anti-fuse element ANTFS201 is small. Therefore, there is no need to increase the current that flows to the anti-fuse element ANTFS201, if the voltage applied to the writing data line WBL when the data is read is set to the high voltage VPP mentioned above, for instance. For this reason, the voltage applied to the writing data line WBL may be set to about the voltage VCOR of about 1 to 2 [V] which is used as the power supply voltage of the logic circuits. Accordingly, the amount of current that flows to the current path composed of the writing data line WBL, the PMOS transistor MP201, the anti-fuse element ANTFS201, and the ground terminal GND is small when the data is read. Consequently, the power consumption of the OTP cell 200 can be reduced compared with the OTP cell 1.

Moreover, in this case, the voltage applied to the node N201 at the time of data reading is about the voltage VCOR at maximum. Accordingly, there is little possibility of destroying the insulation film of the anti-fuse element ANTFS201 in which the data is not written in the 1-CELL. This allows to solve the problem of the OTP cell 1 in that the lifetime of the anti-fuse element in which the data is not written in the 1-CELL is shortened.

In addition, in the OTP cell 200, only the PMOS transistor MP201 and the NMOS transistor MN210 may be composed of the high breakdown voltage transistors, such as the transistor having the MOX structure, in consideration of the high voltage when the data is written. Consequently, the circuit size of the OTP cell 200 can be reduced compared with the OTP cell 1. Note that the voltage applied to the back gate drive signal line CNW is controlled to be equal to the high voltage or the voltage VCOR so that the PMOS transistor MP201 can be turned on in both cases where the voltage applied to the writing data line WBL is equal to the high voltage and where the voltage is equal to the voltage VCOR.

Note that the present invention is not limited to the above exemplary embodiments and can be modified in various manners without departing from the scope of the present invention. For example, although the anti-fuse element is composed of the transistor, the anti-fuse element may be composed of a capacitor or the like capable of dielectric breakdown of an insulation film between electrodes at high voltage.

Circuits that operate in the same manner as in the exemplary embodiments can be obtained also in the following case. That is, in the circuits according to the exemplary embodiments, all of the NMOS transistors may be replaced by PMOS transistors and all of the PMOS transistors may be replaced by NMOS transistors. Further, the power supply voltage VDD may be replaced by the ground voltage GND and the ground voltage GND may be replaced by the power supply voltage VDD. Note that the voltage level of each of control signal lines and data lines is inverted in this case.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
    an anti-fuse element that electrically connects a first node and a first power supply terminal when data is written and electrically disconnects the first node and the first power supply terminal when data is not written;
    a first switch circuit that is connected between the first node and a first data line applied with a predetermine first voltage, and enters an off state from an on state according to a first control signal; and
    a detection part that detects write data of the anti-fuse element according to whether a voltage of the first node is substantially the same as the first voltage or is substantially the same as a supply voltage of the first power supply terminal when the first switch circuit enters the off state,
    wherein the detection part comprises:
    a first transistor; and
    a second switch circuit connected between a second data line and the first transistor,
    wherein a conduction state of the first transistor is controlled according to the voltage of the first node,
    the second switch circuit enters the on state according to a second control signal after the first switch circuit enters the off state,
    the first transistor is connected between the second switch circuit and the first power supply terminal, and
    the write data of the anti-fuse element is judged according to a voltage level of the second data line,
    wherein the first switch circuit comprises a second transistor connected between the first node and the first data line, and the second transistor has a control terminal receiving the first control signal,
    wherein the second switch circuit comprises a third transistor connected between the second data line and the first transistor, and the third transistor has a control terminal receiving the second control signal, and
    wherein a voltage substantially equal to the first voltage applied to the first data line is applied to a back gate of the second transistor when the write data of the anti-fuse element is judged, and
    a voltage substantially equal to the write voltage applied to the first data line is applied to the back gate of the second transistor when the data is written into the anti-fuse element.

2. The semiconductor integrated circuit according to claim 1, wherein
    the first voltage is substantially equal to or less than a power supply voltage of logic circuits included in the semiconductor integrated circuit, and the supply voltage of the first power supply terminal is a ground voltage.

3. The semiconductor integrated circuit according to claim 2, wherein the first and second transistors have a breakdown voltage characteristic against a write voltage that is higher than the power supply voltage of the logic circuits, the write voltage being applied to the anti-fuse element when the data is written.

4. The semiconductor integrated circuit according to claim 3, wherein the first and second transistors have a multi-oxide structure.

5. A one-time programmable cell circuit comprising:
an anti-fuse element that electrically connects a first node and a first power supply terminal when data is written and electrically disconnects the first node and the first power supply terminal when data is not written;
a first switch circuit that is connected between the first node and a first data line applied with a predetermine first voltage, and enters an off state from an on state according to a first control signal; and
a detection part that detects write data of the anti-fuse element according to whether a voltage of the first node is substantially the same as the first voltage or is substantially the same as a supply voltage of the first power supply terminal when the first switch circuit enters the off state,
wherein the detection part comprises:
a first transistor; and
a second switch circuit connected between a second data line and the first transistor,
wherein a conduction state of the first transistor is controlled according to the voltage of the first node,
the second switch circuit enters the on state according to a second control signal after the first switch circuit enters the off state, and outputs a detection result according to the conduction state of the first transistor to the second data line, and
the first transistor is connected between the second switch circuit and the first power supply terminal,
wherein the first switch circuit comprises a second transistor connected between the first node and the first data line and the second transistor has a control terminal receiving the first control signal,
wherein the second switch circuit comprises a third transistor connected between the second data line and the first transistor, and the third transistor has a control terminal receiving the second control signal, and wherein a voltage substantially equal to the first voltage applied to the first data line is applied to a back gate of the second transistor when the write data of the anti-fuse element is detected, and
a voltage substantially equal to the write voltage applied to the first data line is applied to the back gate of the second transistor when the data is written into the anti-fuse element.

6. The one-time programmable cell circuit according to claim 5, wherein
the first voltage is substantially equal to or less than a power supply voltage of logic circuits included in a peripheral circuit of the one-time programmable cell circuit, and
the supply voltage of the first power supply terminal is a ground voltage.

7. The one-time programmable cell circuit according to claim 6, wherein the first and second transistors have a breakdown voltage characteristic against a write voltage that is higher than the power supply voltage of the logic circuits, the write voltage being applied to the anti-fuse element when the data is written.

8. The one-time programmable cell circuit according to claim 7, wherein the first and second transistors have a multi-oxide structure.

9. A data judging method of a data of a semiconductor integrated circuit that comprises an anti-fuse element that electrically connects a first node and a first power supply terminal when data is written and electrically disconnects the first node and the first power supply terminal when data is not written, the method comprising:
switching a first switch circuit from an on state to an off state, the first switch circuit being connected between the first node and a first data line applied with a predetermined first voltage; and
detecting write data of the anti-fuse element according to whether a voltage of the first node is substantially the same as the first voltage or is substantially the same voltage as a supply voltage of the first power supply terminal when the first switch circuit the enters off state,
wherein the first switch circuit comprises a transistor, and
a voltage substantially equal to the first voltage applied to the first data line is applied to a back gate of the transistor when the write data of the anti-fuse element is detected, and
a voltage substantially equal to the write voltage applied to the first data line is applied to the back gate of the transistor when the data is written into the anti-fuse element.

* * * * *